United States Patent
Devgan et al.

(10) Patent No.: US 9,435,839 B2
(45) Date of Patent: Sep. 6, 2016

(54) DISCRIMINATION OF LOW POWER RF SIGNALS USING PHASE MODULATION WITH INJECTION LOCKED LASERS

(71) Applicant: The United States of America, as represented by the Secretary of the Air Force, Washington, DC (US)

(72) Inventors: Preetpaul S Devgan, Dayton, OH (US); Nicholas G Usechak, Dayton, OH (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 28 days.

(21) Appl. No.: 14/693,327

(22) Filed: Apr. 22, 2015

(65) Prior Publication Data

US 2016/0097797 A1    Apr. 7, 2016

Related U.S. Application Data

(60) Provisional application No. 62/060,788, filed on Oct. 7, 2014.

(51) Int. Cl.
*H01S 3/00*    (2006.01)
*G01R 29/08*   (2006.01)
*G01J 1/42*    (2006.01)

(52) U.S. Cl.
CPC ............. *G01R 29/0892* (2013.01); *G01J 1/42* (2013.01); *G01J 2001/4242* (2013.01)

(58) Field of Classification Search
CPC .................................... H01S 3/00; H01S 3/10
USPC ................ 250/214 R, 550; 372/50.12, 50.21
See application file for complete search history.

(56) References Cited

U.S. PATENT DOCUMENTS

| 6,535,328 B2 | 3/2003 | Yao |
| 2003/0197917 A1* | 10/2003 | Yap .................. G02F 2/002 359/330 |
| 2011/0122912 A1* | 5/2011 | Benjamin ............. H01S 5/4006 372/50.124 |
| 2013/0256514 A1 | 10/2013 | Devgan et al. |

OTHER PUBLICATIONS

Raza, J. et al., "Spatial filtering of RF interference in radio astronomy," IEEE Sig. Proc. Lett., vol. 9, pp. 64-67, 2002.
Anderson, G.W. et al., "Advanced channelization for RF, microwave and millimeterwave applications," Proc. IEEE, vol. 79, pp. 355-388, 1991.
Nguyen, L.V.T., "Microwave photonic technique for frequency measurement of simultaneous signals," IEEE Photon. Technol. Lett., vol. 21, pp. 642-644, 2009.

(Continued)

*Primary Examiner* — Kevin Pyo
(74) *Attorney, Agent, or Firm* — AFMCLO/JAZ; Charles Figer, Jr.

(57) ABSTRACT

An apparatus is provided for RF signal discrimination. A master laser of the apparatus is connected to an optical input of an optical phase modulator. The optical phase modulator is configured to receive a plurality of RF signals at an RF input and further configured to receive an output from the master laser at an optical input. A slave laser operating below a lasing threshold is configured to receive a modulated output from the optical phase modulator. An optical filter is configured to receive a mixed signal generated inside the slave laser. A photodetector receives the filtered mixed signal and is configured to recover a RF signal from the plurality of RF signals, where a frequency of a sideband of the recovered RF signal corresponds to a mode of the slave laser.

16 Claims, 3 Drawing Sheets

(56) References Cited

OTHER PUBLICATIONS

Rasras, M. S. et al.,"Demonstration of a Fourth-Order Pole-Zero Optical Filter Integrated Using CMOS Processes," IEEE J. Lightwave Tech., vol. 25, No. 1, pp. 87-92, 2007.

Zou, X. et al., "Microwave Frequency Measurement Based on Optical Power Monitoring using a Complementary Optical Filter Pair," IEEE Trans. Microw. Theory Tech., vol. 57, pp. 505-511, 2009.

Devgan, P. S. et al., "Detecting low-power RF signals using a multimode optoelectronic oscillator and integrated optical filter," IEEE Photon. Technol. Lett., vol. 22, pp. 152-154, 2010.

Devgan, P. S. et al., "Detection of low-power RF signals using a two laser multimode optoelectronic oscillator," IEEE Photonics Technology Letters, vol. 24, No. 10, May 2012, pp. 857-859.

Yao, X. S.,"Phase-to-Amplitude Modulation Conversion using Brillouin Selective Sideband Amplification," IEEE Photonics Technology Letters, vol. 10, No. 2, Feb. 1998, pp. 264-266.

Hong, C. et al.,"Single-Sideband Modulation Basedon an Injection-Locked DFB Laser in Radio-Over-Fiber Systems," IEEE Photonics Technology Letters, vol. 22, No. 7, Apr. 2010, pp. 462-464.

Xiong, J. et al., "A Novel Approach to Realizing SSB Modulation With Optimum Optical Carrier to Sideband Ratio," IEEE Photonics Technology Letters, vol. 25, No. 12, Jun. 2013, pp. 1114-1116.

\* cited by examiner

DISCRIMINATION OF LOW POWER RF SIGNALS USING PHASE MODULATION WITH INJECTION LOCKED LASERS

CROSS-REFERENCE TO RELATED APPLICATIONS

This application claims the benefit of and priority to U.S. Provisional Application Ser. No. 62/060,788, entitled "Discrimination of Low Power RF Signals Using Phase Modulation with Injection Locked Lasers," filed on Oct. 7, 2014, the entirety of which is incorporated by reference herein.

RIGHTS OF THE GOVERNMENT

The invention described herein may be manufactured and used by or for the Government of the United States for all governmental purposes without the payment of any royalty.

BACKGROUND OF THE INVENTION

1. Field of the Invention

The present invention generally relates to discrimination of low power RF signals and, more particularly, discrimination of low power RF signals utilizing injection locked lasers.

2. Description of the Related Art

The ability to discriminate specific very low power RF signals in a cluttered environment is important in both military and civilian applications such as radio astronomy and channelization. For these applications, it is important to not only determine the frequency of the signal but also not add any loss to the signal. Photonic techniques are preferred for performing these applications as they have broad instantaneous bandwidths. While demonstrations have been proposed to detect RF frequencies in a noisy environment using dispersion, narrow-band optical filters or power monitoring of two lasers, these methods have not focused on preventing loss to very low power RF signals.

Other methods that can be used to detect and amplify low RF power signals include the use of a multi-mode optoelectronic oscillator (MM-OEO). The MM-OEO uses electrical injection locking of an RF signal to the MM-OEO cavity modes in order to provide either loss or gain for specific RF frequencies. The drawback of the MM-OEO, however, is the mode spacing depends on the length of the cavity. Additionally, the ratio between loss and gain is limited to approximately 25 dB and the frequencies which receive gain cannot be tuned. Accordingly, there is a need in the art for better discrimination low power RF signals.

SUMMARY OF THE INVENTION

Embodiments of the invention provide hardware and methodology to discriminate selected low power RF signals from other unwanted signals. The system works by amplifying the selected RF signal while suppressing all other RF signals, regardless of their power. By injecting the output of a master laser that has been phase modulated with RF signals into a slave laser, selected RF signals will see gain while other unwanted signals are suppressed. Embodiments of the invention have utility for applications such as RF channelization as well as RF frequency identification of unknown signals.

Embodiments of the RF signal discrimination apparatus include a master laser. An optical phase modulator is configured to receive a plurality of RF signals at an RF input and is further configured to receive an output from the master laser at an optical input. A slave laser operating below a lasing threshold is configured to receive a modulated output from the optical phase modulator. An optical filter is configured to filter a received mixed signal generated by the slave laser. A photodetector receives the filtered mixed signal and is configured to recover a RF signal from the plurality of RF signals, where a frequency of a sideband of the recovered RF signal corresponds to a mode of the slave laser. Some embodiments additionally include an optical circulator positioned between the optical phase modulator, the slave laser, and the optical filter. The optical circulator is configured to receive the modulated output from the optical phase modulator and output the modulated output to be received at the slave laser. The optical circulator is further configured to receive the mixed signal from the slave laser and output the mixed signal to be received by the optical filter.

Embodiments of the invention also provide a method of discriminating an RF signal. A received plurality of RF signals is optically modulated onto an optical carrier generated by a master laser via a phase modulator. The optically modulated plurality of RF signals is injected into an optical output of a slave laser. A mixed signal containing the optically modulated plurality of RF signals from the slave laser is filtered with an optical filter, isolating a mode of the slave laser. An RF signal is recovered from the filtered mixed signal containing the optically modulated plurality of RF signals, where a frequency of a sideband of the recovered RF signal corresponds to a mode of the slave laser.

In some embodiments, recovering an RF signal consists of recovering an RF signal having an imbalance in a magnitude of upper and lower sidebands of the RF signal while suppressing an RF signal having balanced magnitudes of the upper and lower sidebands of the RF signal. In some other embodiments, recovered RF signals are subjected to a threshold to eliminated unwanted RF signals not suppressed.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

Embodiments of the invention provide a technique for using a master laser whose optical output is phase modulated with an RF signal and then optically injection locked into a multimode slave laser. The resulting optical signal is photodetected and the resulting RF signal will see either gain or loss. Such a system can be used to discriminate RF signals in a cluttered environment as well as for determining the RF frequency of the signal.

Figure 1:
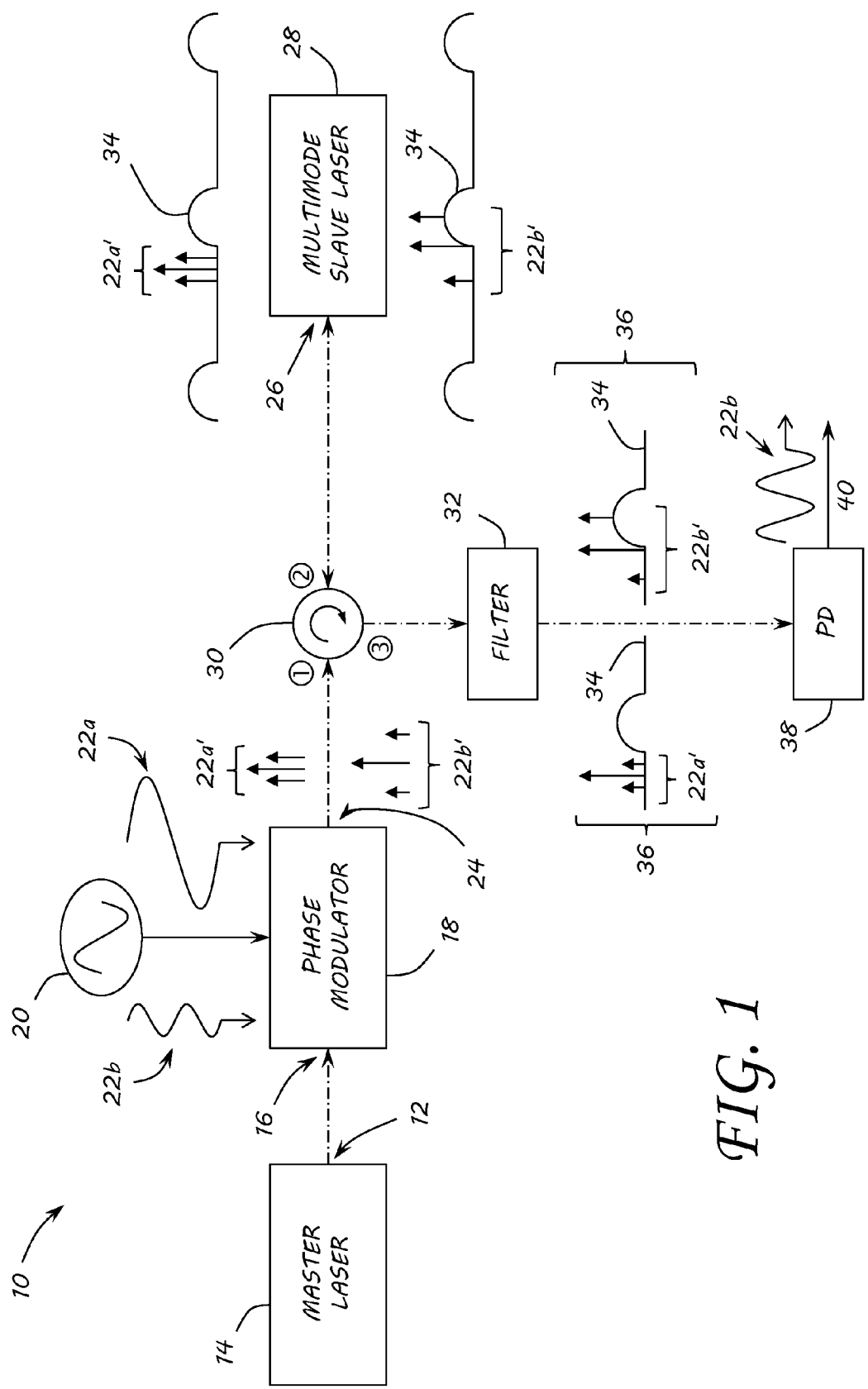
FIG. 1 is a schematic diagram of an exemplary embodiment of the invention configured for discrimination of low power RF signals.

A system 10 for RF signal discrimination is illustrated in FIG. 1. An optical output 12 of a master laser 14 is connected to an optical input 16 of a phase modulator 18. An RF input 20 of the phase modulator 18 is received a signal of interest, which is illustrated as two signals 22a, 22b in this embodiment for simplicity and to assist in describing an embodiment of the invention. An optical output 24 containing the signals 22a' and 22b' of the phase modulator 18 is injected into an optical output 26 of a multimode slave laser 28 via an optical circulator 30 via port ①-②. A mixed signal 36 generated inside the slave laser 28 is then outputted to an optical filter 32 in order to select a mode 34 of the slave laser 28, via a third port ③ of the optical circulator 30. The filtered optical signal is then connected to the input of a photodetector 38. The resulting RF signal (22b) from the photodetector 38 may then be measured. The multimode slave laser 28 may be biased below threshold in order to provide gain to an incoming RF modulated signal from the master laser 14. In the illustrated example, the larger RF signal 22a input to the phased modulator 18 does not appear at the RF output 40, since it does not line up with the mode 34 of the slave laser. The smaller RF signal 22b does match the slave laser mode 34 and so appears at the RF output 40 and is larger, representing gain.

In one embodiment, a wavelength of the master laser 14 may be set to a wavelength of one of the modes 34 of the slave laser 28 minus a RF frequency of interest. Under this condition, the wavelength of the upper sideband generated by the RF signal on the master laser 14 may match the wavelength of one of the modes 34 of the slave laser 28. The upper sideband may then see gain while the lower sideband will generally see loss. At the photodetector 38, the resulting RF signal 40 will generally see gain as compared to the RF signal at the phase modulator input 20. Note that the system 10 may be set to amplify the lower sideband with the same result. Alternatively, when RF signal sidebands do not match a wavelength of any of the modes of the slave laser 28, there will be no RF signal present at the output 40 of the photodetector 38. This is inherent to the phase modulation process as long as the sidebands power levels are equal. Thus the system 10 may completely suppress a RF signal if it does not match the appropriate conditions.

Figure 2:
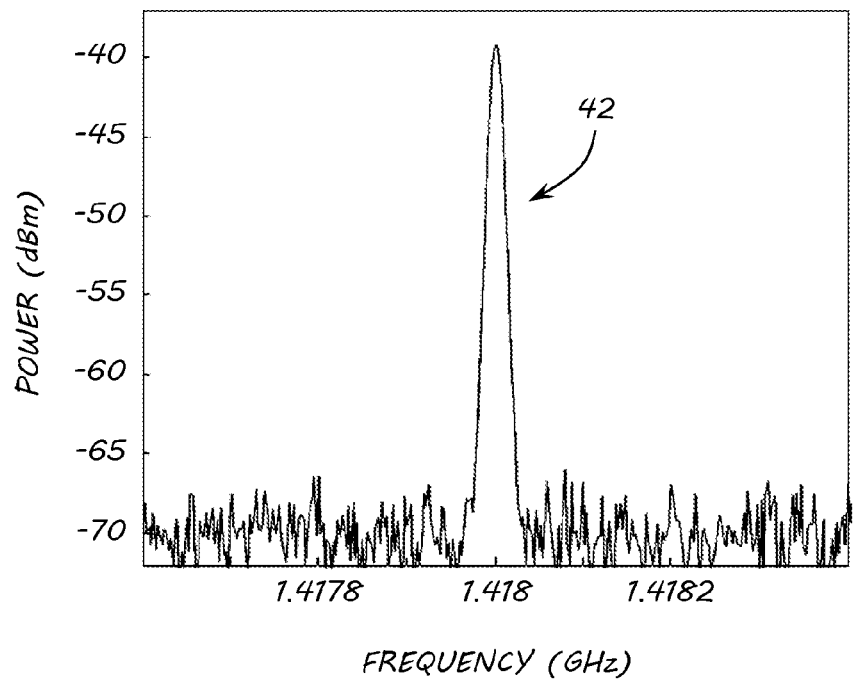
FIG. 2 is a graph illustrating measured RF power after the photodetector of a 14.18 GHz input RF signal with a power of −40 dBm.
Figure 3:
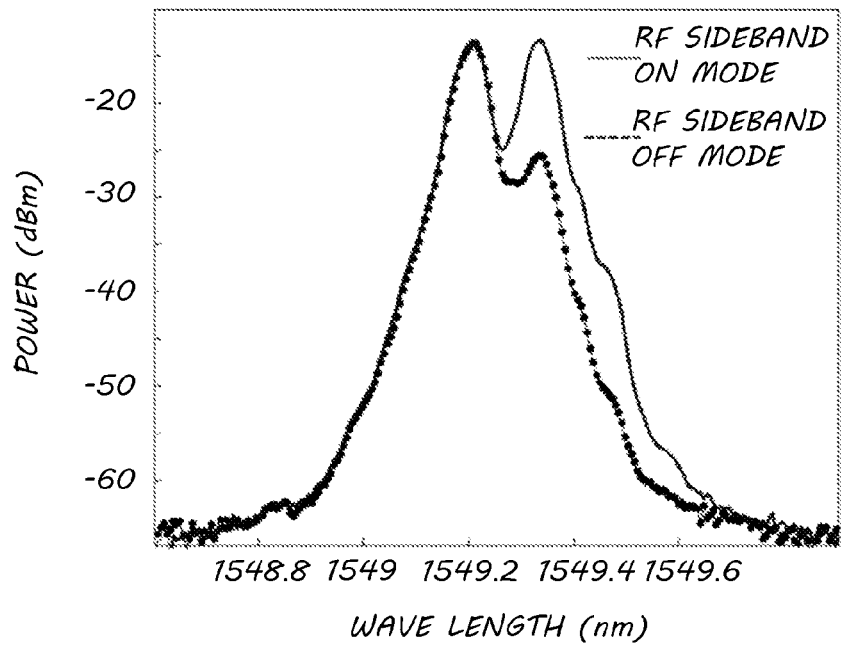
FIG. 3 is a graph illustrating optical spectrum when the RF sideband is on the mode and sees gain and when the RF sideband is off-mode and sees loss.

When an optical sideband is set to a wavelength of one of the modes of the slave laser 28, a resulting sideband is higher than the other sideband, which sees optical loss. This allows the otherwise balanced signal to be detected at the photodetector 38. A measurement has been made with an RF signal at 14.18 GHz input to the phase modulator. The input power was −40 dBm and the measured output power was −39 dBm, showing a gain of 1 dB, as seen in the output curve 42 in FIG. 2. When the RF signal frequency is moved off of the slave laser's 28 operating wavelength, there is no observable signal. In the optical spectrum, the side mode is amplified to the same level as the carrier, as seen in FIG. 3. However, when the signal is moved off the operating point, the sideband becomes much lower than the optical carrier.

Figure 4:
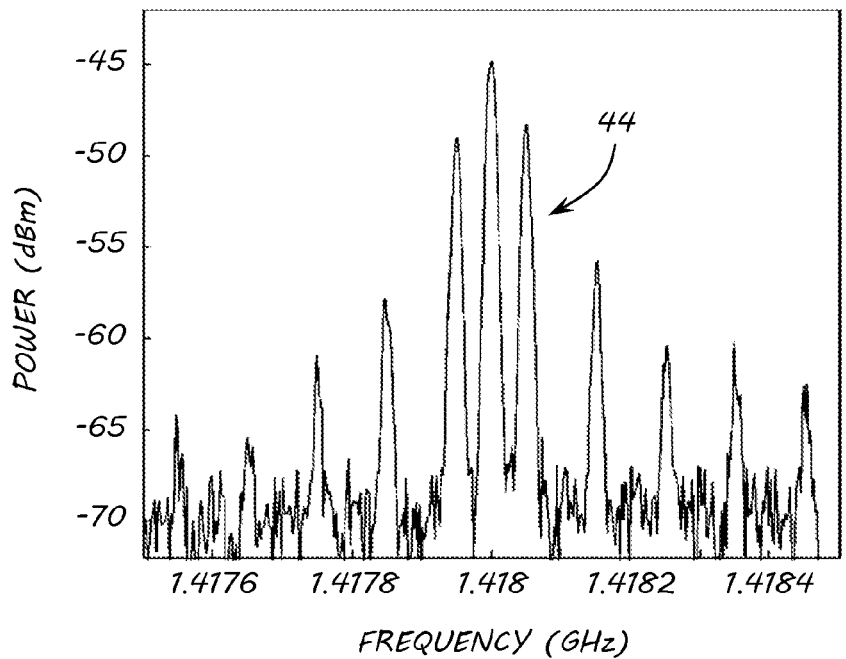
FIG. 4 is a graph illustrating measured RF power of an RF carrier at 14.18 GHz with 500 kHz pulse modulation.
Figure 5:
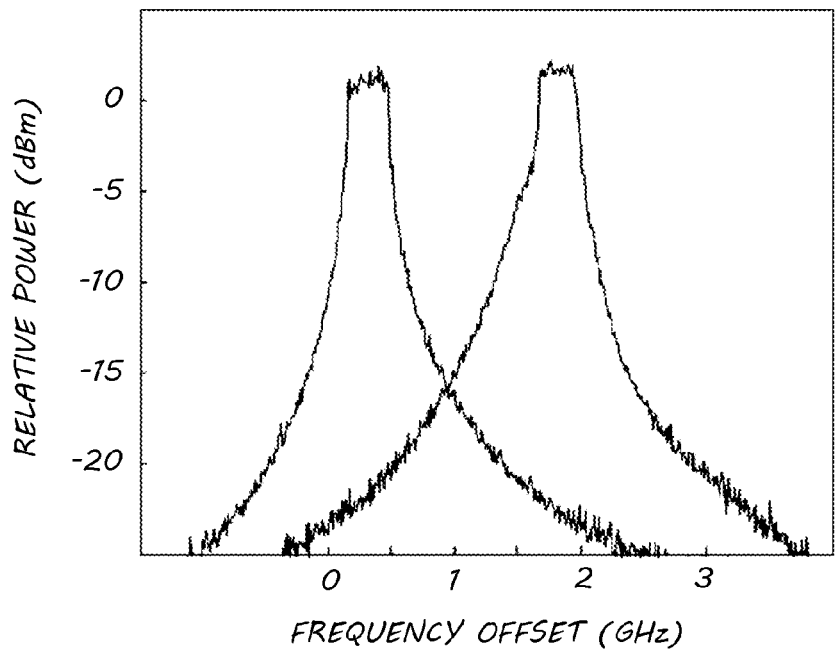
FIG. 5 is a graph illustrating RF power measurement showing the gain peak being swept over a frequency range of 1.8 GHz.

When the sideband is not amplified, there is no observable signal at the output of the photodetector 38. The system 10 may also detect RF signals which have been modulated by other data. For example, the RF signal at 14.18 GHz has been modulated with a 500 kHz pulse. As seen by curve 44 in FIG. 4, the RF signal is amplified along with the 500 kHz sidebands, allowing the data to be recovered. The additional sidebands are higher frequency components due to the pulse shape. Note that any modulation can be amplified as long as it is within the gain bandwidth of the system 10. By changing the bias current of the slave laser 28, the wavelength changes, consequently changing the RF frequency that will be amplified. In this case, the current can be changed on the order of approximately 100 nsec. The RF frequency to be amplified may be tuned over a frequency range of greater than 1 GHz in that time frame. Thus, the system 10 is able to give gain to both the carrier frequency as well as the sidebands generated by the pulse modulation. This demonstrates the ability to recover sub-modulation as well as carrier information. FIG. 5 illustrates an RF power measurement a gain peak being swept over a frequency range of 1.8 GHz.

A mathematical description of the phase modulation is shown below. The phase modulator has a transfer function given by $$E_{out}(t) = \sqrt{\alpha_{PM} G_{opt}} e^{i\phi(t)} E_{in}(t) \quad (1)$$

where $\alpha_{PM}$ is the optical insertion loss of the phase modulator, $G_{opt}$ is optical gain/loss before the photodetector, $\phi(t) = \phi_{rf} \sin(\Omega_{rf} t)$ and $\phi_r = \pi(V_{rf}/V_{\pi,rf}(\Omega_{rf}))$. Now using the Jacobi Anger expansion $e^{iz \sin \theta} = \sum_{n=-\infty}^{\infty} J_n(z) e^{in\theta}$ the following can be written $$E_{carrier}(t) = \sqrt{\alpha_{PM} G_{opt}} E_{in} e^{i\omega_0 t} [J_0(\phi_{rf})],$$

$$E_{usb,fund}(t) = \sqrt{\alpha_{PM} G_{opt}} E_{in} e^{i\omega_0 t - i\Omega_{rf} t} [-J_1(\phi_{rf})],$$

$$E_{carrier}(t) = \sqrt{\alpha_{PM} G_{opt}} E_{in} e^{i\omega_0 t + i\Omega_{rf} t} [J_1(\phi_{rf})], \quad (2)$$

where $\omega_0$ is the optical frequency of the laser and $J_n$ is the Bessel function of the n-th order. At the photodetector, the carrier field beats with both the upper and lower sidebands in order to generate an optical photocurrent. In the case of phase modulation, the resulting mixing terms are given below $$E_{carrier} \times E^*_{usb,fund} = \alpha_{PM} P_{laser} G_{opt} [J_0(\phi_{rf})] [-J_1(\phi_{rf})] e^{i\Omega_{rf} t},$$

$$E^*_{carrier} \times E_{usb,fund} = \alpha_{PM} P_{laser} G_{opt} [J_0(\phi_{rf})] [-J_1(\phi_{rf})] e^{-i\Omega_{rf} t},$$

$$E_{carrier} \times E^*_{lsb,fund} = \alpha_{PM} P_{laser} G_{opt} [J_0(\phi_{rf})] [J_1(\phi_{rf})] e^{-i\Omega_{rf} t},$$

$$E^*_{carrier} \times E_{lsb,fund} = \alpha_{PM} P_{laser} G_{opt} [J_0(\phi_{rf})]$$
$$[J_1(\phi_{rf})]e^{i\Omega_{rf}t}, \quad (3)$$

where $E_{in}E_{in}^* = P_{laser}$. By inspection, when the four terms are added together they cancel and no RF photocurrent will be generated. So as long as the two sidebands are equal in power, the RF signal will be completely suppressed at the output of the photodetector. However, when the phase modulated optical signal is injection locked into the slave laser, one sideband can be made higher than the other sideband. In the illustrated embodiment above, the upper sideband is made larger than the lower sideband, though other embodiments may make the lower sideband larger than the upper sideband. This may be represented by making $G_{opt}$ different for the upper sideband than for the lower sideband. Including this in Equation 3, is it found that the terms do not add to zero but give the following result for the photocurrent.

$$I_{PD} = \Re \, \alpha_{PM} P_{laser} (G_{opt,usb}/G_{opt,lsb} - 1) J_0(\phi_{rf}) J_1(\phi_{rf}) \cos(\Omega_{rf}t), \quad (4)$$

where there is a different $G_{opt}$ for the lower and upper sideband and $\Re$ is the responsivity of the photodetector. Since we are interested in low power RF signals, a small signal approximation may be taken for the Bessel functions and the RMS output RF power given may be found by $P_{rf} = 1/2 I_{PD}^2 Z_{out}$, with $Z_{out}$ being the output impedance of 50 ohms. The small signal RF power is then given by the following $$P_{rf,ss,out} = \frac{1}{4}(\Re \, \alpha_{PM} P_{laser})^2 (G_{opt,usb}/G_{opt,lsb} - 1)\pi^2 \frac{V_{rf}^2}{V_{\pi,rf}^2} \phi_{rf} Z_{out}. \quad (5)$$

Now the RF gain is simply the ratio of output RF power to the input RF power, which is given by $P_{rf,in} = V_{rf}/(2Z_{in})$ with $Z_{in}$ being the input impedance. The RF gain is given by the following in both linear and dB units.

$$G_{rf} = \frac{(\Re \, \alpha_{PM} P_{laser})^2 (G_{opt,usb}/G_{opt,lsb} - 1)^2 \pi^2 Z_{out} Z_{in}}{4V_{\pi,rf}^2}, \text{ (linear)} \quad (6)$$

$$G_{rf} = -22.1 + 20\log_{10}(\Re \, \alpha_{PM} P_{laser}) -$$
$$20\log_{10}(V_{\pi,rf}) + 20\log_{10}(G_{opt,usb}/G_{opt,lsb} - 1), \text{ (dB)}.$$

The system can see positive gain when the ratio of sidebands is enough to compensate for the $V_{\pi,rf}$ of the modulator. This mathematical description demonstrates the use of the system 10 to either completely suppress an RF signal or to provide gain to an RF signal.

This method in embodiments of the invention provides an RF discriminator with fast tuning speeds that can provide gain to specific RF signals while completely suppressing other RF signals. The fast tuning speed is useful for reconfigurable systems that need to change the RF discriminator's frequency very quickly. The use of injection locked lasers improves the mode spacing when compared to contemporary MM-OEO configurations. The ability to provide gain without the use of an electronic amplifier increases the frequency range over which the system works when compared to systems that require electronic gain. Embodiments of the system 10 may also be more compact when compared to the MM-OEO configurations.

Any optical phase modulator can be used. The slave laser can be a multimode (e.g., Fabry-Perot) laser or a single mode laser. The master laser can be any wavelength as long as it is matched by the slave laser. Any photodetector can be used as long as it is a square-law optical detector. Other configurations may include multiple master lasers or one master laser that is sweeping. Alternatively, another configuration may include multiple single mode slave lasers with a single master laser. Thresholding may be added to the embodiments of the invention after the photodetector to eliminate unwanted signals where there may be small imbalances in the upper and lower sidebands. In other embodiments, the thresholding may be included as a post-processing function.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. A RF signal discrimination apparatus, comprising:
   a master laser;
   an optical phase modulator configured to receive a plurality of RF signals at an RF input and further configured to receive an output from the master laser at an optical input;
   a slave laser operating below a lasing threshold configured to receive a modulated output from the optical phase modulator;
   an optical filter configured to filter a received mixed signal generated by the slave laser; and
   a photodetector receiving the filtered mixed signal and configured to recover a RF signal from the plurality of RF signals,
   wherein a frequency of a sideband of the recovered RF signal corresponds to a mode of the slave laser.

2. The RF signal discrimination apparatus of claim 1, further comprising:
   an optical circulator positioned between the optical phase modulator, the slave laser, and the optical filter,
   wherein the optical circulator is configured to receive the modulated output from the optical phase modulator and output the modulated output to be received at the slave laser, and
   wherein the optical circulator is further configured to receive the mixed signal from the slave laser and output the mixed signal to be received by the optical filter.

3. The RF signal discrimination apparatus of claim 1, wherein RF signals of the plurality of RF signals not having a sideband with a frequency corresponding to a mode of the slave laser are suppressed.

4. The RF signal discrimination apparatus of claim 1, wherein the mode of the slave laser provides a gain to the sideband with the frequency corresponding to the mode.

5. The RF signal discrimination apparatus of claim 1, wherein the slave laser is a multi-mode laser.

6. The RF signal discrimination apparatus of claim 1, wherein the slave laser is a single mode laser.

7. The RF signal discrimination apparatus of claim 1, wherein the maser laser is configured to sweep a plurality of frequencies.

8. The RF signal discrimination apparatus of claim 1, wherein the master laser is a first master laser, the apparatus further comprising:
 a second maser laser;
 the optical phase modulator configured to receive an output from the second master laser at the optical input.

9. The RF signal discrimination apparatus of claim 8, wherein the optical modulator is configured to receive the optical output from the second master laser at an alternate optical input.

10. The RF signal discrimination apparatus of claim 1, wherein the photodetector is a square-law optical detector.

11. The RF signal discrimination apparatus of claim 1, wherein the slave laser is a first slave laser and the optical filter is a first optical filter, the apparatus further comprising:
 a second slave laser operating below a lasing threshold and configured to receive the modulated output from the optical phase modulator;
 a second optical filter configured to filter a received mixed signal generated by the second slave laser; and
 the photodetector configured to receive the filtered received mixed signals from the first and second optical filter.

12. A method of discriminating an RF signal, the method comprising:
 optically modulating a received plurality of RF signals onto an optical carrier generated by a master laser via a phase modulator;
 injecting the optically modulated plurality of RF signals into an optical output of a slave laser,
 filtering a mixed signal containing the optically modulated plurality of RF signals from the slave laser with an optical filter; and
 recovering an RF signal from the filtered mixed signal containing the optically modulated plurality of RF signals,
 wherein a frequency of a sideband of the recovered RF signal corresponds to a mode of the slave laser.

13. The method of claim 12, further comprising:
 suppressing RF signals of the plurality of RF signals from the mixed signal containing the optically modulated plurality not having a sideband with a frequency corresponding to the mode of the slave laser.

14. The method of claim 12, wherein recovering an RF signal comprises:
 recovering an RF signal having an imbalance in a magnitude of upper and lower sidebands of the RF signal; and
 suppressing an RF signal having balanced magnitudes of the upper and lower sidebands of the RF signal.

15. The method of claim 14, further comprising:
 thresholding recovered RF signals to eliminated unwanted RF signals not suppressed.

16. The method of claim 14, further comprising:
 providing a gain to a sideband of an RF signal with a frequency corresponding to the mode of the slave laser to create an imbalance in the magnitudes of the upper and lower sidebands of the RF signal.

* * * * *